United States Patent [19]

Jun

[11] Patent Number: 5,468,677
[45] Date of Patent: Nov. 21, 1995

[54] ISOLATION STRUCTURE OF SEMICONDUCTOR DEVICE AND METHOD FOR FORMING THE SAME

[75] Inventor: Young K. Jun, Seoul, Rep. of Korea

[73] Assignee: Goldstar Electron Co., Ltd., Choongchungbook-Do, Rep. of Korea

[21] Appl. No.: 360,602

[22] Filed: Dec. 21, 1994

[30] Foreign Application Priority Data

Oct. 21, 1994 [KR] Rep. of Korea .................. 26961/1994

[51] Int. Cl.$^6$ .................................................. H01L 21/76
[52] U.S. Cl. ................... 437/70; 437/69; 437/72; 437/73
[58] Field of Search ........................... 437/69, 70, 72, 437/73

[56] References Cited

U.S. PATENT DOCUMENTS

| | | | |
|---|---|---|---|
| 4,380,481 | 4/1983 | Shimbo | 437/69 |
| 5,220,192 | 6/1993 | Owens et al. | 437/70 |
| 5,242,849 | 9/1993 | Sato | 437/69 |
| 5,376,230 | 12/1994 | Ito | 437/69 |

FOREIGN PATENT DOCUMENTS

| | | | |
|---|---|---|---|
| 0105651 | 8/1981 | Japan | 437/69 |
| 0122669 | 5/1990 | Japan | 437/70 |

*Primary Examiner*—Brian E. Hearn
*Assistant Examiner*—Trung Dang

[57] ABSTRACT

An isolation structure of a semiconductor device including a channel stop diffusion region selectively formed on a portion of a single crystalline silicon substrate disposed beneath an edge of a field oxide film formed on the substrate, thereby capable of selectively increasing, irrespective of a pattern size of the field region, a channel ion concentration at an edge of a field region where the field region is connected to an active region and which region is a weak area serving to decrease a channel stop ion concentration at an interface between the field oxide film and the silicon substrate and to decrease a threshold voltage of a field transistor due to a small thickness thereof and thereby locally increasing the threshold voltage. By the local increase in threshold voltage, it is possible to prevent a degradation in insulating characteristic of the field transistor with a small pattern size.

11 Claims, 7 Drawing Sheets

ISOLATION STRUCTURE OF SEMICONDUCTOR DEVICE AND METHOD FOR FORMING THE SAME

BACKGROUND OF THE INVENTION

1. Field of the Invention

The present invention relates to a technique of forming a channel stop doping region on a silicon substrate disposed beneath a field oxide film in a semiconductor device, and more particularly to an isolation structure of a semiconductor device capable of selectively increasing a channel stop doping concentration only at a portion of a silicon substrate disposed beneath an edge of a field oxide film and thereby improving an insulating characteristic of a field transistor with a small pattern, and to a method for forming such an isolation structure.

2. Description of the Prior Art

In integrated circuit field, generally, as means for insulating active regions of a silicon substrate with one another, a local oxidation of silicon (LOCOS) process has been mainly used to form a field oxide film on a field region of the silicon substrate.

In accordance with the LOCOS process, a pad oxide film is formed over a single crystalline silicon substrate. A nitride film pattern is then formed only on a portion of the pad oxide film disposed over an active region of the single crystalline substrate. Using the nitride film pattern as a mask, a field oxide film is selectively formed on a field region of the single crystalline substrate.

In a case of an integrated circuit fabricated using the LOCOS process, a field transistor, that is, an N-field transistor is parasitically formed between adjacent active regions of $n^+$ diffusion layers formed on a p type single crystalline silicon substrate.

This will be described in more detail. In the integrated circuit to which the LOCOS process is applied, a pad oxide film and a nitride film are sequentially formed over the p type single crystalline silicon substrate. The nitride film is then patterned so that it remains only at its portions respectively corresponding to active regions of $n^+$ diffusion layers on the silicon substrate. Using the patterned nitride film as a mask, p type impurity ions such as boron ions are implanted as a channel stop doping ion in a field region of the silicon substrate. A field oxide film is then selectively formed on a field region of the silicon substrate using a self alignment doping process. As a result, a parasitic N-field transistor is formed which is constituted by active regions of $n^+$ diffusion layers and the ion-implanted channel stop region disposed between the active regions.

In this case, however, a segregation phenomenon that boron ions implanted in the silicon substrate move toward the field oxide film occurs during the formation of the field oxide film. Due to such a segregation phenomenon, the concentration of boron ion at the interface between the field oxide film and the silicon substrate is decreased after completion of the formation of field oxide film. This results in a decrease in threshold voltage of the parasitic field transistor.

In the integrated circuit to which the LOCOS process is applied, a bird's beak phenomenon also occurs at a portion of the field oxide film disposed in a boundary region between the field region and each active region. Such a bird's beak of the field oxide film penetrates the active region, thereby causing the active region to be substantially reduced.

Due to the lateral diffusion of channel stop ions occurring during the formation of field oxide film, the active region is substantially reduced, thereby resulting in an increase in the junction capacitance between the active region and the corresponding diffusion layer. This also results in an increase in junction leakage current. As a result, there is a limitation on high integration of semiconductor devices.

In order to effectively achieve high integration of semiconductor devices, there have been newly proposed various methods for minimizing the bird's beak and improving the channel stop doping.

One of such methods is to avoid the segregation of channel stop ions at the interface between the field oxide film and the single crystalline silicon substrate. As such a method, a through field ion implantation method has been used which is illustrated in FIG. 1. In accordance with the through field ion implantation method, as shown in FIG. 1, a pad oxide film 2 is formed over a single crystalline silicon substrate 1. In the silicon substrate 1, a $n^+$ diffusion regions 3 is formed at each active region. A field oxide film 4 is formed on each field region of the silicon substrate 1. In the entire structure of the silicon substrate 1 with the field oxide film 4, boron ions 5 for channel stop doping are subsequently implanted at a high energy. By virtue of the structure, the implanted boron ions 5 is prevented from being segregated.

In the structure obtained in accordance with the through field ion implantation method, however, the threshold voltage of field transistor varies sensitively depending on the thickness of field oxide film 4 that is dependent upon the size of a pattern for isolation region. Even when the same oxidation condition is used in field oxide films having different isolation region pattern sizes, the field oxide film of a smaller pattern size has a smaller thickness than the field oxide film of a larger pattern size. This may be because a concentration of stress occurs at an edge of the isolation region pattern.

For this reason, the penetration depth of boron ions in the silicon substrate 1 is larger at a region where the field oxide film 4 has a smaller thickness than at a region where the field oxide film 4 has a larger thickness. As a result, it is difficult to complement the concentration of channel stop ions at the interface between the field oxide film and the silicon substrate in accordance with the through field ion implantation method.

Where a blank ion implantation is used in combination with the through field ion implantation method, an increase in ion concentration occurs at a portion of the silicon substrate disposed beneath the junction of active region. This results in an increase in junction capacitance and a decrease in the junction breakdown voltage of the n+/p junction. When the ion implantation is carried out under a condition that a mask is defined using a photoetch process, in order to prevent the above-mentioned problem, only a portion of the p type silicon substrate corresponding to the field region may have an increased ion doping concentration selectively. In this case, however, an alignment tolerance is present between the mask and the field region. Consequently, this method is difficult to be applied to a structure having field regions with a small pattern size.

In order to solve this problem, there has been proposed a new through field ion implantation method using a channeling. A structure fabricated in accordance with this method is illustrated in FIG. 2. As shown in FIG. 2, in each active region of a p type single crystalline silicon substrate 11, a $n^+$ diffusion regions 13 is formed. A field oxide film 14 is formed on each field region of the silicon substrate In the entire structure of the silicon substrate 11 with the field oxide film 14, boron ions 15 for channel stop doping are subsequently implanted.

In accordance with the method of FIG. 2, the ion implantation is carried out under a condition that an ion beam alignment has been adjusted, thereby increasing the ion concentration at the interface between the field oxide film and the silicon substrate in either of the region where a field oxide film with a small pattern is disposed or the region where a thin field oxide film with a large pattern. In accordance with this method, a channeling is induced in the active region. As a result, it is possible to improve the junction capacitance and the junction breakdown voltage.

However, this method also involves a variation in the penetration depth of channel stop ions depending on the pattern size of the field region. As a result, a variation in insulating characteristic may occur.

The method which fabricates the structure of FIG. 2 will be described in detail in conjunction with FIGS. 3A to 3C. In FIGS. 3A to 3C, elements respectively corresponding to those in FIG. 2 are denoted by the same reference numerals.

In accordance with the method, first, over a single crystalline silicon substrate 11, a pad oxide film 12 is formed to a thickness of about 350Å, as shown in FIG. 3A. A nitride film 16 is then formed to a thickness of 1,500Å over the pad oxide film 12. Thereafter, the nitride film 16 and the pad oxide film 12 are partially removed at their portions respectively disposed over field regions, having different pattern sizes, of the silicon substrate 11 using the well-known photoetch process, thereby exposing corresponding surface portions of the silicon substrate 110 As a result, patterns of the nitride film 16 and the pad oxide film 12 are obtained which cover active regions of the silicon substrate 11.

Thereafter, the exposed portions of substrate 11 corresponding to the field regions are subjected to a thermal oxidation using the patterned nitride film 16 as an oxidation barrier so as to form a field oxide film 14, as shown in FIG. 3B. The thermal oxidation is carried out such that the field oxide film 14 has a bulk thickness of about 7,000Å at its portion disposed over each field region having a larger pattern size and a maximum thickness of about 4,200Å at its portion disposed over each field region having a smaller pattern size.

The nitride film 16 and the pad oxide film 12 are then completely removed, as shown in FIG. 3C. Subsequently, boron ions are implanted as channel stop ions in the entire surface of the substrate 11 without using any mask. The ion implantation is carried out at an energy of 140 KeV and in a dose of $3\times10^{12}$ ions/cm$^2$ under a condition that beams of boron ions are oriented in perpendicular to the surface of substrate 11 oriented in the <100> direction.

In this case, the projected range of boron ions is 4,000Å in the region corresponding to the field oxide film 14 and 8,000Å in the region corresponding each exposed portion of substrate 11.

In other words, in the region where the field oxide film 14 has a minimum thickness the thickness of the field oxide film portion indicated by "a" in FIG. 3 corresponds to the projected range of boron ions. In the region where the field oxide film 14 has a larger thickness, the thickness of the field oxide film portion, namely, a bird's beak portion indicated by "b" in FIG. 3 corresponds to the projected range of boron ions.

As apparent from the above description, all the conventional methods involve a variation in the thickness of field oxide film depending on the pattern size of isolation region. As a result, they can not obtain a uniform insulating characteristic because of a variation in the concentration of boron ions for channel stop at the interface between the field oxide film and the silicon substrate and a variation in interface occupying area both caused by the variation in the thickness of field oxide film. Moreover, the boron ions are implanted even in the active region. This results in an increase in junction capacitance and an increase in leakage current.

SUMMARY OF THE INVENTION

Therefore, an object of the present invention is to provide an isolation structure of a semiconductor device capable of selectively increasing a channel ion concentration at an edge of a field region where the field region is connected to an active region irrespective of a pattern size of the field region and thereby locally increasing a threshold voltage of a field transistor, thereby achieving an improvement in insulating characteristic of the field transistor with a small pattern size, and to provide a method for forming the isolation structure.

In accordance with one aspect, the present invention provides an isolation structure of a semiconductor device comprising: a substrate; a field insulating film formed on a surface portion of the substrate corresponding to a field region; and a channel stop diffusion region defined along a portion of the substrate disposed beneath an edge of the field insulating film.

In accordance with another aspect, the present invention provides a method for forming an isolation structure of a semiconductor device, comprising the steps of: forming a first insulating film on a first portion of a substrate except for a field region; sequentially forming a second insulating film and a third insulating film over the entire exposed surface of the resulting structure; forming a side wall comprised of a part of the third insulating film on a portion of the second insulating film disposed over a second portion of the substrate corresponding to the field region; forming a field insulating film on a predetermined portion of the resulting structure corresponding to the field region using the side wall as a mask; removing the side wall implanting channel stop ions in a third portion of the substrate corresponding to a region defined beneath the side wall; and annealing the implanted channel stop ions and thereby forming a channel stop diffusion region.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
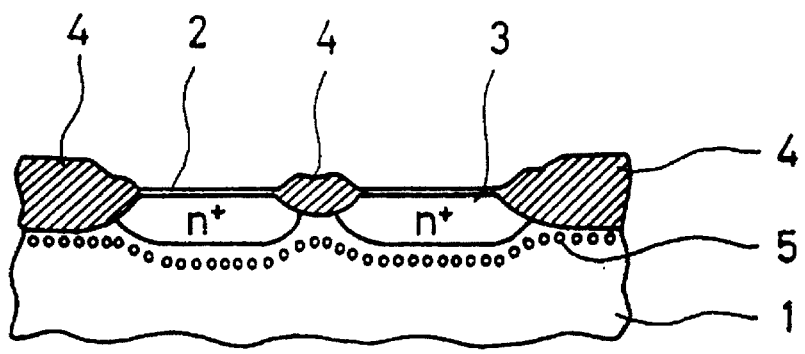
FIG. 1 is a sectional view illustrating an isolation structure of a semiconductor device fabricated in accordance with a conventional through-field ion implantation method.
Figure 2:
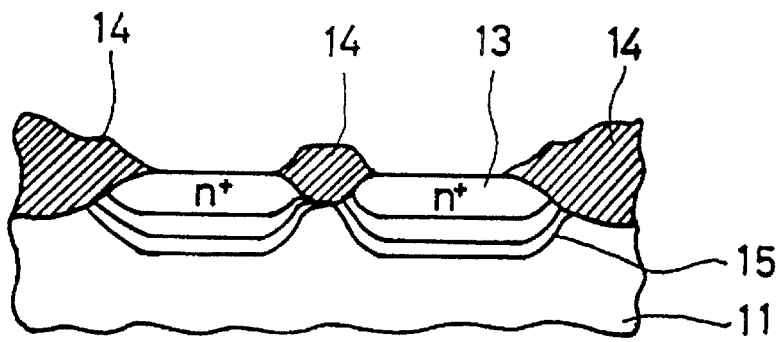
FIG. 2 is a sectional view illustrating an isolation structure of a semiconductor device fabricated in accordance with another conventional through-field ion implantation method.
Figure 3A:
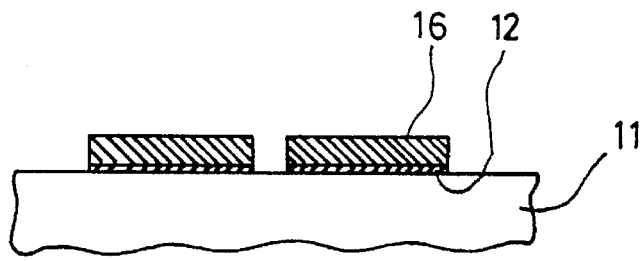
FIGS. 3A to 3C are sectional views respectively illustrating a method for forming the isolation structure shown in FIG. 2.
Figure 3B:
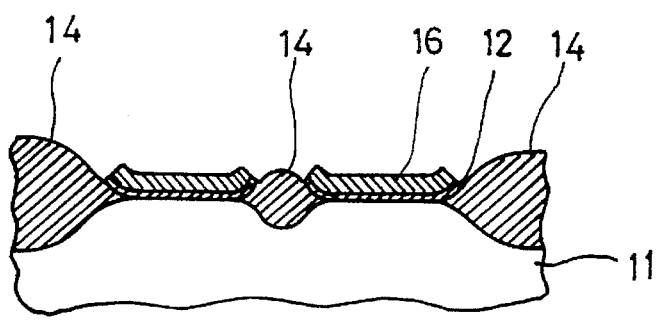
Figure 3C:
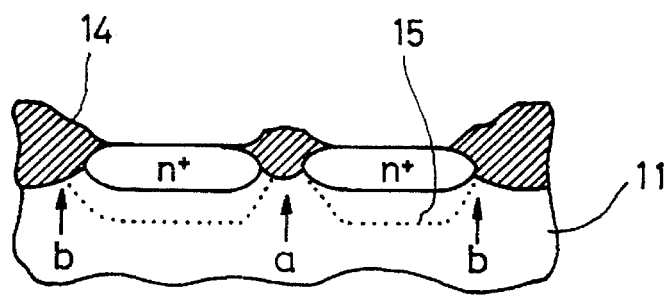
Figure 4:
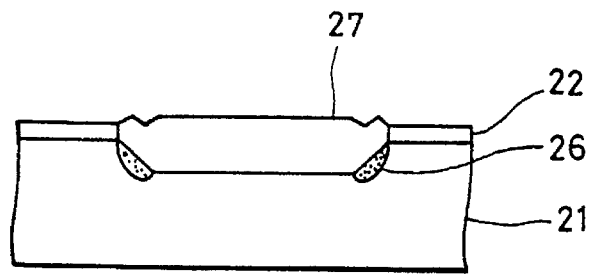
FIG. 4 is a sectional view illustrating an isolation structure of a semiconductor device in accordance with an embodiment of the present invention.

Referring to FIG. 4, there is illustrated an isolation structure of a semiconductor device in accordance with an embodiment of the present invention. The isolation structure includes a pad oxide film 22 formed on a portion of a single crystalline silicon substrate 21 except for field regions, and a field oxide film 24 formed on a portion of the single crystalline silicon substrate 21 corresponding to each field region. The isolation structure also includes channel stop diffusion regions 26 which are formed by implanting channel stop doping ions in surface portions of the silicon substrate 21 exposed at edges of the field oxide film 24 defined upon etching the field oxide film 24 and then annealing the ion-implanted portions of silicon substrate 21. The isolation structure further includes a field oxide film 27 which is formed by forming an oxide film on each of the channel stop diffusion regions 26.

Now, a method for forming the isolation structure of FIG. 4 in accordance with the present invention will be described in conjunction with FIGS. 5A to 5E. In FIGS. 5A to 5E, elements respectively corresponding to those in FIG. 4 are denoted by the same reference numerals.

Figure 5A:
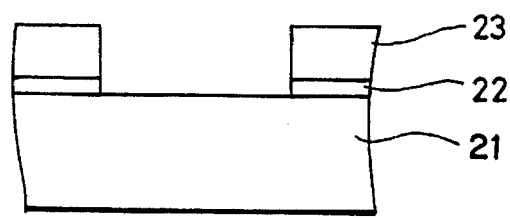
FIGS. 5A to 5E are sectional views respectively illustrating a method for forming the isolation structure shown in FIG. 4 in accordance with the present invention.

In accordance with this method, first, over a single crystalline silicon substrate 21, a pad oxide film 22 is formed to a thickness of 150 to 300Å, as shown in FIG. 5A. A nitride film 23 is then formed to a thickness of 4,000Å over the pad oxide film 22. Thereafter, the nitride film 23 and the pad oxide film 22 are partially removed at their portions respective disposed over the field regions of the silicon substrate 21 using the well-known photoetch process, thereby exposing surface portions of the silicon substrate 11 respectively corresponding to the field regions. As a result, patterns of the nitride film 23 and the pad oxide film 22 are obtained which cover active regions of the silicon substrate 21.

Figure 5B:
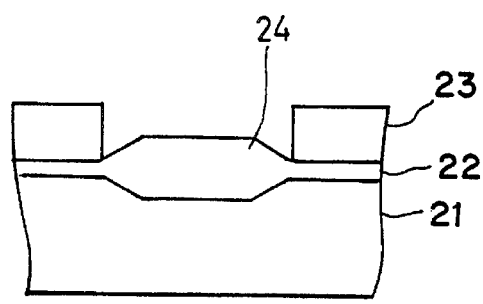

Using the patterned nitride film 23 as a mask, the resulting structure is then subjected to an annealing in an oxidative atmosphere containing PYRO($H_2+O_2$) or vapor at a temperature of 900° to 1,100° C. for about 120 minutes, thereby forming a field oxide film 24 on the portion of silicon substrate 21 corresponding to each field region, as shown in FIG. 5B. The formation of field oxide film 24 is carried out such that the field oxide film 24 has a thickness of about 600Å at the field region with a large pattern size.

Figure 5C:
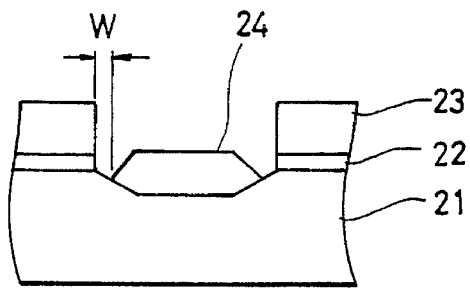
Figure 5D:
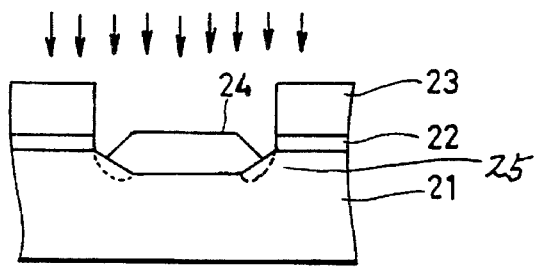
Figure 5E:
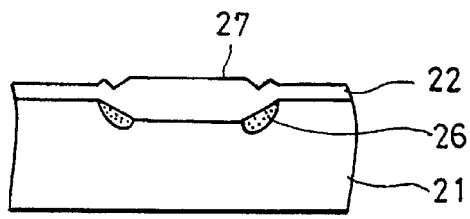

Thereafter, the edge portions of field oxide film 24 having the minimum thickness are etched by use f a dry etch process using a gas containing $CF_4$ or $CHF_3$ or a wet etch process using a solution containing HF or the like until portions of the silicon substrate 21 respectively disposed beneath the etched edge portions are exposed, as shown in FIG. 5C. As a result, the silicon substrate 21 is exposed at regions each having a width W while the field oxide film 24 is exposed along the peripheral edge of the oxide film Using an oxidation preventing film constituted by both the pad oxide film 22 and the nitride film 23 and the thicker portion of the field oxide film 24 as a mask, channel stop ions 25 such as B or $BF_2$ are implanted in the field region of N type at an accelerated voltage of 30 to 80 KeV and in a dose of 2 to 5 E13/$cm^2$ as shown in FIG. 5D Subsequently, the resulting structure is subjected to an annealing in an oxidative atmosphere or an inert atmosphere so as to activate the implanted ions 25. By the activation of implanted ions 25, channel stop diffusion regions 26 are formed. An oxide film is formed over each channel stop diffusion region 26, thereby forming a final field oxide film 27. Finally, the remaining nitride film 23 is removed using a phosphoric acid solution. Thus, the isolation structure shown in FIG. 4 is obtained.

Figure 6:
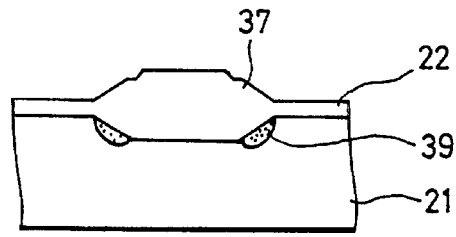
FIG. 6 is a sectional view illustrating an isolation structure of a semiconductor device in accordance with another embodiment of the present invention.

Referring to FIG. 6, there is illustrated an isolation structure of a semiconductor device in accordance with another embodiment of the present invention. In FIG. 6, elements respectively corresponding to those in FIG. 4 are denoted by the same reference numerals. The isolation structure shown in FIG. 6 includes a pad oxide film 22 formed on a portion of a single crystalline silicon substrate 21 except for field regions, and a field oxide film 37 formed on a portion of the single crystalline silicon substrate 21 corresponding to each field region using a mask constituted by side walls of a nitride film temporarily provided. The isolation structure also includes channel stop diffusion regions 39 which are formed by implanting channel stop doping ions in surface portions of the silicon substrate 21 exposed upon etching the side walls of nitride film and then annealing the ion-implanted portions of silicon substrate 21.

Now, a method for forming the isolation structure of FIG. 6 in accordance with the present invention will be described in conjunction with FIGS. 7A to 7E. In FIGS. 7A to 7E, elements respectively corresponding to those in FIG. 6 are denoted by the same reference numerals.

Figure 7A:
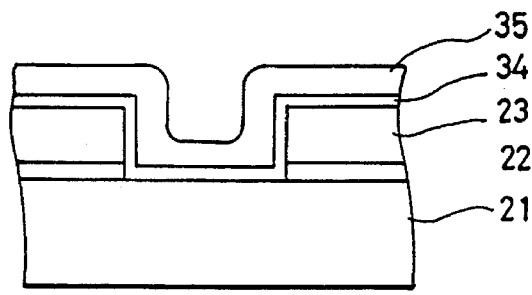
FIGS. 7A to 7E are sectional views respectively illustrating a method for forming the isolation structure shown in FIG. 6 in accordance with the present invention.

In accordance with this method, first, over a structure obtained in the same manner as that in FIG. 7A, an oxide film 34 is formed to a thickness of 100 to 300Å, as shown in FIG. 7A. A nitride film 35 is then deposited over the oxide film 34 to a thickness corresponding to a width W1 of a channel stop doping region to be subsequently defined. The deposition of nitride film 35 is carried out at a temperature of 700° to 800° C. using a chemical vapor deposition process.

Figure 7B:
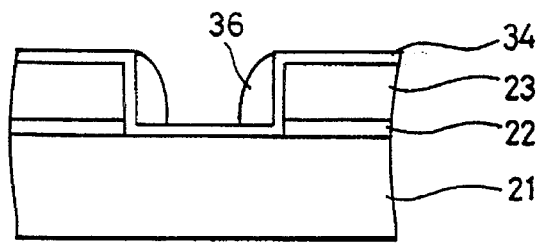

Thereafter, the nitride film 35 is subjected to an anisotropic dry etch process using a gas such as $CF_4$ or $SF_6$, but without using any mask until the surface of oxide film 34 is exposed. As a result, side walls 36 of the nitride film 35 are formed, as shown in FIG. 7B.

Figure 7C:
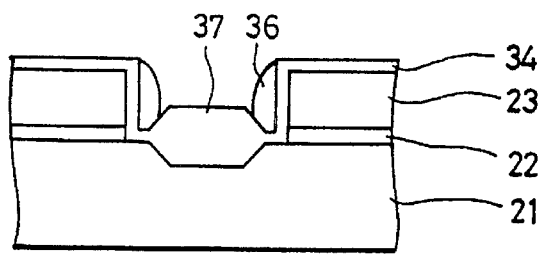

Using the side walls of nitride film 35 as a mask, the resulting structure is then subjected to a thermal oxidation so as to grow a field oxide film 37, as shown in FIG. 7C.

Figure 7D:
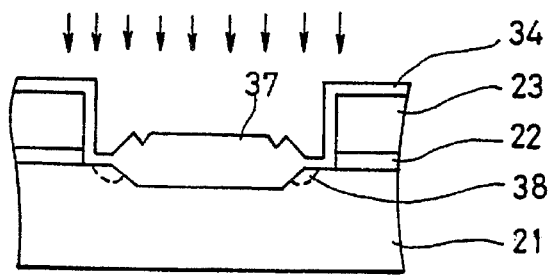

Thereafter, the side walls 36 are removed, as shown in FIG. 7D. Ions 38 such as B or $BF_2$ are then implanted in the field region of N type of the substrate 21.

Figure 7E:
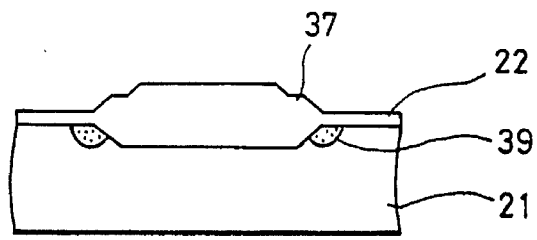

As shown in FIG. 7E, the oxide film 34 is then removed. The resulting structure is then subjected to an annealing in an oxidative atmosphere or an inert atmosphere, thereby activating the implanted ions 38. By the activation of implanted ions 38, channel stop diffusion regions 39 are formed. Finally, the remaining nitride film 35 is removed using a phosphoric acid solution. Thus, the isolation structure shown in FIG. 6 is obtained.

Figure 8:
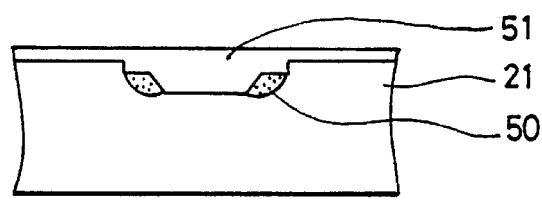
FIG. 8 is a sectional view illustrating an isolation structure of a semiconductor device in accordance with another embodiment of the present invention.

FIG. 8 is a sectional view illustrating an isolation structure of a semiconductor device in accordance with another embodiment of the present invention. In FIG. 8, elements respectively corresponding to those in FIG. 4 are denoted by the same reference numerals. The isolation structure shown in FIG. 8 includes a field oxide film 51 formed on a recessed portion of the single crystalline silicon substrate 21 corresponding to each field region using a mask constituted by side walls of a nitride film temporarily provided. The recessed portion of silicon substrate 21 is formed by etching a corresponding portion of silicon substrate 21 to a predetermined depth. The isolation structure also includes channel stop diffusion regions 50 which are formed by implanting channel stop doping ions in regions of the silicon substrate 21 exposed upon etching the side walls of nitride film and then annealing the ion-implanted portions of silicon substrate 21. As an oxide film fills subsequently the regions of silicon substrate 21 where the side walls of nitride film have been removed, the field oxide film 51 has a planarized surface.

Now, a method for forming the isolation structure of FIG. 8 in accordance with the present invention will be described in conjunction with FIGS. 9A to 9F. In FIGS. 9A to 9F, elements respectively corresponding to those in FIG. 8 are denoted by the same reference numerals.

Figure 9A:
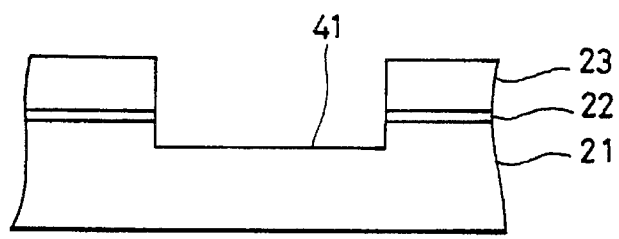
FIGS. 9A to 9F are sectional views respectively illustrating a method for forming the isolation structure shown in FIG. 9 in accordance with the present invention.

In accordance with this method, first, on a portion of a single crystalline silicon substrate 21 except for field regions, an oxidation preventing film constituted by a pad oxide film 22 and a nitride film 23 is formed in the same manner as in FIG. 5A, as shown in FIG. 9A. Using the oxidation preventing film as a mask, an exposed portion of the silicon substrate 21 corresponding to each field region is then dry etched to a predetermined depth, thereby forming a recess 41. In this case, the depth of the recess 41 is determined so that it corresponds to about a hale of the thickness of a field oxide to be grown on each field region with a small pattern size, thereby enabling the field oxide film to be flush with the surface portion of the silicon substrate 21 corresponding to each active region.

Figure 9B:
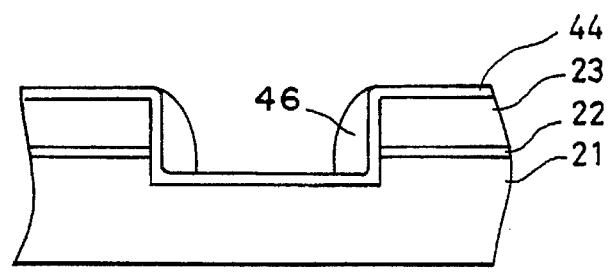

Over the resulting structure shown in FIG. 9A, an oxide film 44 is then formed to a thickness of 100 to 300Å, as shown in FIG. 9B. A nitride film is then deposited over the oxide film 44 to a thickness corresponding to a width W of a channel stop doping region to be subsequently defined. The deposition of nitride film is carried out at a temperature of 700° to 800° C. using the chemical vapor deposition process. Thereafter, the nitride film is subjected to an anisotropic dry etch process using a gas such as $CF_4$ or $SF_6$, but without using any mask until the surface of oxide film 44 is exposed. As a result, side walls 46 comprised of the remaining nitride film portions are formed.

Figure 9C:
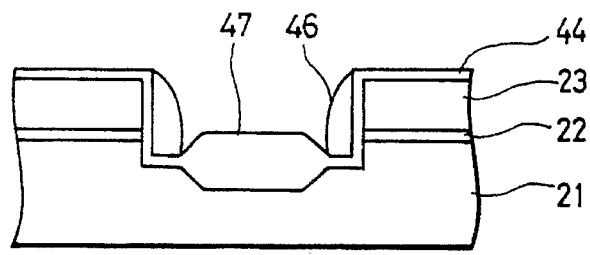

Using the side walls 46 as a mask, the resulting structure is then subjected to a thermal oxidation so as to grow a field oxide film 47, as shown in FIG. 9C.

Figure 9D:
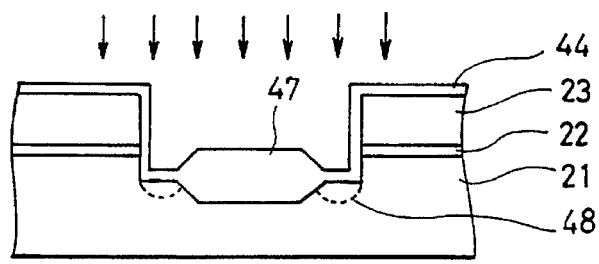

Thereafter, the side walls 46 are removed, as shown in FIG. 9D. Ions 48 such as B or $BF_2$ are then implanted in the field region of N type of the substrate 21.

Figure 9E:
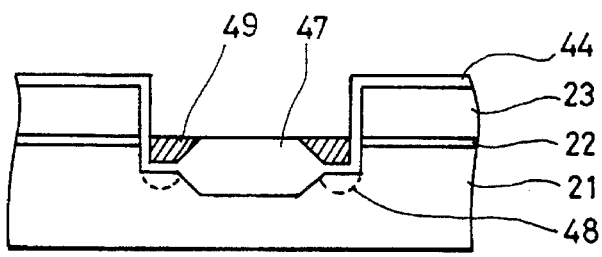

Over the entire exposed surface of the resulting structure shown in FIG. 9D, a film 49 which may be one of an oxide film, an amorphous silicon film and a polysilicon film is then deposited using the chemical vapor deposition process, as shown in FIG. 9E. Subsequently, the deposition film 49 is etched back using a gas such as $CF_4$ in the case of the oxide film and using a gas such as $CHF_3+O_2$ or $SF_6$ in the case of the amorphous silicon film or the polysilicon film. This etch-back is continued until the surface of field oxide film 47 is exposed. As a result, the deposition film 49 remains only at edges of the field region. The remaining deposition film 49 is flush with the exposed field oxide film 47. That is, a planarization is achieved.

Figure 9F:
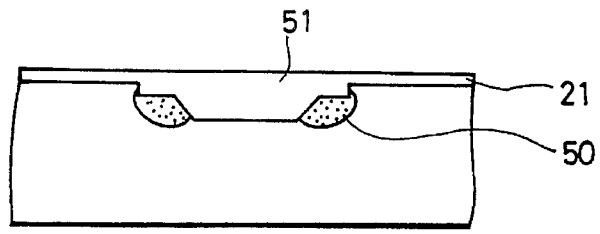

As shown in FIG. 9F, the resulting structure is then subjected to an annealing to form diffusion regions 50. The annealing is carried out in an oxidative atmosphere or an inert atmosphere in the case that the deposition film 49 is the oxide film. Where the deposition film 49 is the amorphous silicon film or the polysilicon film, the annealing is carried out in an oxidative atmosphere. By the annealing, the deposition film 49 is oxidized while the channel stop ions 48 are activated, thereby forming the diffusion regions 50. Finally, the oxide film 44 and the nitride film 23 are sequentially removed. Thus, the isolation structure shown in FIG. 8 is obtained.

As apparent from the above description, the present invention provides an isolation structure of a semiconductor device and method for forming the same, capable of selectively increasing a channel ion concentration at a weak area serving to decrease a channel stop ion concentration at an interface between an active region and a field region due to a small thickness thereof upon defining the field region, thereby achieving an improvement in the insulating characteristic of field transistor and capable of uniformly forming a channel stop doping region, thereby minimizing a variation in insulating characteristic depending on the size of the field region.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming an isolation structure of a semiconductor device, comprising the steps of:

forming an insulating film on a first portion of a substrate except for a field region;

forming a field insulating film on a second portion of the substrate corresponding to the field region;

partially exposing the second surface portion of the substrate by a predetermined width along an edge of the field insulating film;

implanting channel stop ions in the exposed portion of the substrate; and annealing the implanted channel stop ions and thereby forming a channel stop diffusion region.

2. The method in accordance with claim 1, wherein the step of partially exposing the second surface portion of the substrate comprises the step of etching the edge of the field insulating film using the insulating film as a mask.

3. The method in accordance with claim 1, wherein the step of implanting channel stop ions is carried out under a condition that the insulating film and the field insulating film are used as a mask.

4. A method for forming an isolation structure of a semiconductor device, comprising the steps of:

forming a first insulating film on a first portion of a substrate except for a field region;

sequentially forming a second insulating film and a third insulating film over the entire exposed surface of the resulting structure;

forming a side wall comprised of a part of the third insulating film on a portion of the second insulating film disposed over a second portion of the substrate corresponding to the field region;

forming a field insulating film on a predetermined portion of the resulting structure corresponding to the field region using the side wall as a mask;

removing the side wall;

implanting channel stop ions in a third portion of the substrate corresponding to a region defined beneath the side wall; and annealing the implanted channel stop ions and thereby forming a channel stop diffusion region.

5. A method for forming an isolation structure of a semiconductor device, comprising the steps of:

forming a first insulating film on a first portion of a substrate except for a field region;

sequentially forming a second insulating film and a third insulating film over the entire exposed surface of the resulting structure;

forming a side wall comprised of a part of the third insulating film on a portion of the second insulating film disposed over a second portion of the substrate corresponding to the field region;

forming a field insulating film on a predetermined portion of the resulting structure corresponding to the field region using the side wall as a mask;

removing the side wall;

implanting channel stop ions in a third portion of the substrate corresponding to a region defined beneath the side wall;

forming a planarizing layer along the field insulating film; and annealing the implanted channel stop ions and thereby forming a channel stop diffusion region.

6. The method in accordance with claim 5, wherein the step of forming the planarizing layer comprises the steps of depositing an insulating film over the entire exposed surface of the resulting structure obtained after forming the field insulating film, and then etching back the insulating film.

7. The method in accordance with claim 6, wherein the step of etching back the insulating film is carried out such that the planarizing layer is flush with the field insulating film.

8. The method in accordance with claim 5, wherein the planarizing layer is comprised of an oxide film.

9. The method in accordance with claim 5, wherein the planarizing layer is oxidized at the step of annealing the implanted channel stop ions to form the channel stop diffusion region.

10. The method in accordance with claim 9, wherein the planarizing layer is comprised of an amorphous silicon layer.

11. The method in accordance with claim 9, wherein the planarizing layer is comprised of a polysilicon layer.

* * * * *